(12) United States Patent
Tang et al.

(10) Patent No.: US 8,385,084 B2
(45) Date of Patent: Feb. 26, 2013

(54) SHIELDING STRUCTURES FOR SIGNAL PATHS IN ELECTRONIC DEVICES

(76) Inventors: Jinbang Tang, Chandler, AZ (US);
Jong-Kai Lin, Chandler, AZ (US);
Ronald V. McBean, Chandler, AZ (US)

( * ) Notice: Subject to any disclaimer, the term of this patent is extended or adjusted under 35 U.S.C. 154(b) by 24 days.

(21) Appl. No.: 12/962,893

(22) Filed: Dec. 8, 2010

(65) Prior Publication Data

US 2011/0075394 A1    Mar. 31, 2011

Related U.S. Application Data

(62) Division of application No. 11/741,870, filed on Apr. 30, 2007, now Pat. No. 7,869,225.

(51) Int. Cl.
*H05K 9/00* (2006.01)

(52) U.S. Cl. .............. 361/818; 361/816; 361/679.01; 361/780; 361/795; 361/799

(58) Field of Classification Search .............. 361/816, 361/818, 795, 799, 679.01, 780
See application file for complete search history.

(56) References Cited

U.S. PATENT DOCUMENTS

| | | | |
|---|---|---|---|
| 5,414,597 A | 5/1995 | Lindland et al. | |
| 6,219,254 B1 | 4/2001 | Akerling et al. | |
| 6,356,448 B1 | 3/2002 | DiBene, II et al. | |
| 6,420,208 B1 | 7/2002 | Pozder et al. | |
| 6,601,293 B1 | 8/2003 | Glenn | |
| 6,803,252 B2 | 10/2004 | Lao et al. | |
| 6,822,880 B2 | 11/2004 | Kovacs et al. | |
| 6,867,668 B1 | 3/2005 | Dagostino et al. | |
| 6,919,226 B2 | 7/2005 | Ogawa et al. | |
| 6,984,571 B1 | 1/2006 | Enquist | |
| 7,013,558 B2 | 3/2006 | Bachman | |
| 2001/0013650 A1 | 8/2001 | Goetz et al. | |
| 2002/0057883 A1 | 5/2002 | Malone et al. | |
| 2003/0006851 A1 | 1/2003 | Wood | |
| 2003/0034487 A1 | 2/2003 | Bengtson et al. | |
| 2003/0036259 A1 | 2/2003 | Tate et al. | |
| 2003/0051910 A1 * | 3/2003 | Dyke et al. .................. | 174/262 |
| 2003/0112091 A1 | 6/2003 | Lemke et al. | |
| 2003/0119279 A1 | 6/2003 | Enquist | |
| 2004/0000425 A1 | 1/2004 | White | |
| 2004/0043643 A1 | 3/2004 | Adams | |
| 2004/0238939 A1 | 12/2004 | Wu | |
| 2004/0251501 A1 | 12/2004 | Catalasan | |
| 2004/0266384 A1 | 12/2004 | Davis | |
| 2005/0046001 A1 | 3/2005 | Warner | |
| 2005/0046510 A1 | 3/2005 | Kerner et al. | |
| 2005/0067676 A1 | 3/2005 | Mahadevan et al. | |

(Continued)

FOREIGN PATENT DOCUMENTS

| | | |
|---|---|---|
| EP | 1182913 A1 | 2/2002 |
| EP | 1189271 A2 | 3/2002 |

(Continued)

*Primary Examiner* — Yuriy Semenenko
*Assistant Examiner* — Andargie M Aychillhum
(74) *Attorney, Agent, or Firm* — Ingrassia Fisher & Lorenz, P.C.

(57) ABSTRACT

A shielding structure is provided for shielding a signal path extending between a first layer and a second layer in an electronic device at a transition region with a transition that extends in a first direction and a second direction orthogonal to the first direction. The shielding structure includes a shielding structure portion, which includes a first shielding via in proximity to a first area of the signal path at the transition; a second shielding via in proximity to a second area of the signal path at the transition; and an area metallization electrically coupled to the first shielding via.

15 Claims, 4 Drawing Sheets

| U.S. PATENT DOCUMENTS | | | FOREIGN PATENT DOCUMENTS | | |
|---|---|---|---|---|---|
| 2005/0077634 A1 | 4/2005 | Seaman et al. | GB | 2416925 A | 2/2006 |
| 2005/0085103 A1 | 4/2005 | Driscoll et al. | WO | 0247172 A1 | 6/2002 |
| 2005/0098886 A1 | 5/2005 | Pendse | WO | 2006019336 A2 | 2/2006 |
| 2005/0250310 A1 | 11/2005 | Ogawa | | | |
| 2005/0287850 A1 | 12/2005 | Minich et al. | | | |
| 2006/0038168 A1 | 2/2006 | Estes et al. | * cited by examiner | | |

SHIELDING STRUCTURES FOR SIGNAL PATHS IN ELECTRONIC DEVICES

RELATED APPLICATION

This application is a Divisional of co-pending U.S. patent application Ser. No. 11/741,870, filed on Apr. 30, 2007.

TECHNICAL FIELD

The present invention generally relates to shielding structures for signal paths in electronic devices, and more particularly relates to shielding structures for signal paths having transitions between layers and modules in electronic devices.

BACKGROUND OF THE INVENTION

In electronic devices, integrated circuits are formed on semiconductor substrates using a number of different processing operations that create the circuit elements. The circuit elements can include transistors, resistors, capacitors, interconnects, and other functional structures. The electronic devices can include a single module with a plurality of interconnected layers or a plurality of interconnected modules, each with a plurality of interconnected layers. One example of the latter type of electronic device is a "flip chip module," which includes a semiconductor die that is connected to a package substrate. Bond pads or some other type of interconnect provide for the transfer of electrical signals and power between the semiconductor die and the substrate.

The interconnects between the layers of a multilayer module or between modules in a multi-module device provide a signal path between the respective layers and modules. Signal paths can be subject to deterioration, particularly at the transitions between the respective layers and modules, and more particularly in ultra-wide band and high frequency applications. Electronic devices can have many active signal paths operating simultaneously and in close proximity to each other. The signals of the signal paths can radiate and interfere with each other and introduce noise that can affect the integrity of the signals. The deterioration resulting from resonance, discontinuities, and interference, such as electromagnetic interference (EMI), often limits the performance of ultra-wide band, high frequency applications. Conventional electronic devices have attempted to partially shield the signal paths from interference, but the results have been unacceptable.

Accordingly, it is desirable to provide shielding structures for signal paths having transitions between layers and/or modules that shield the signal paths from interference. In addition, it is desirable to provide electronic devices that utilize shielding structures for shielding signal paths transitioning between two semiconductor layers from interference. It is further desirable to provide a method for manufacturing semiconductor devices with signal paths transitioning between two layers that include shielding structures that shield the signal paths from interference. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
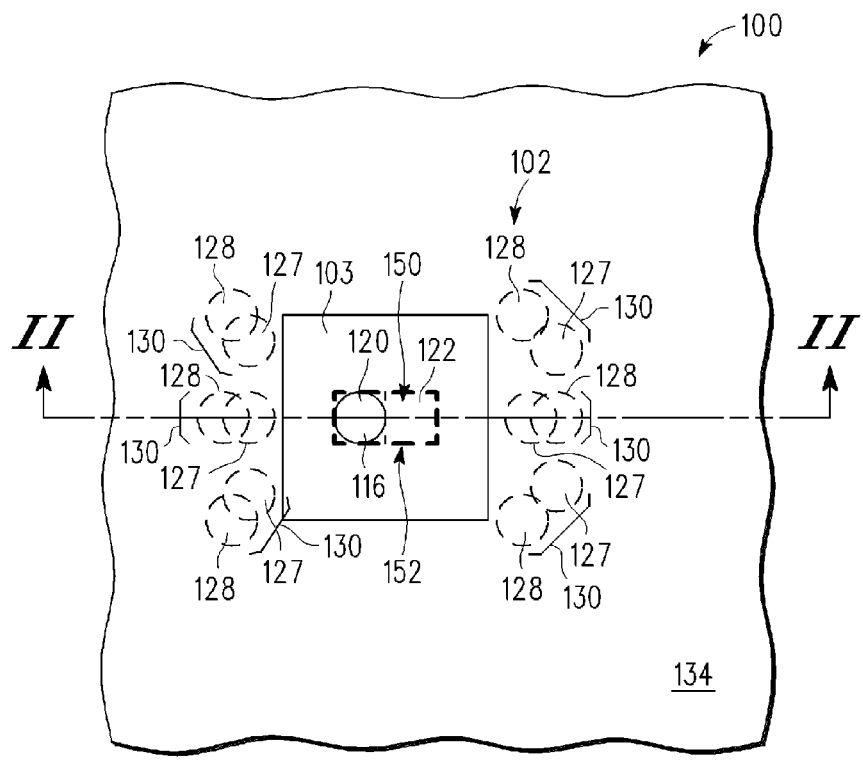
FIG. 1 is a top view of an electronic device with a shielding structure in accordance with an exemplary embodiment of the present invention.
Figure 2:
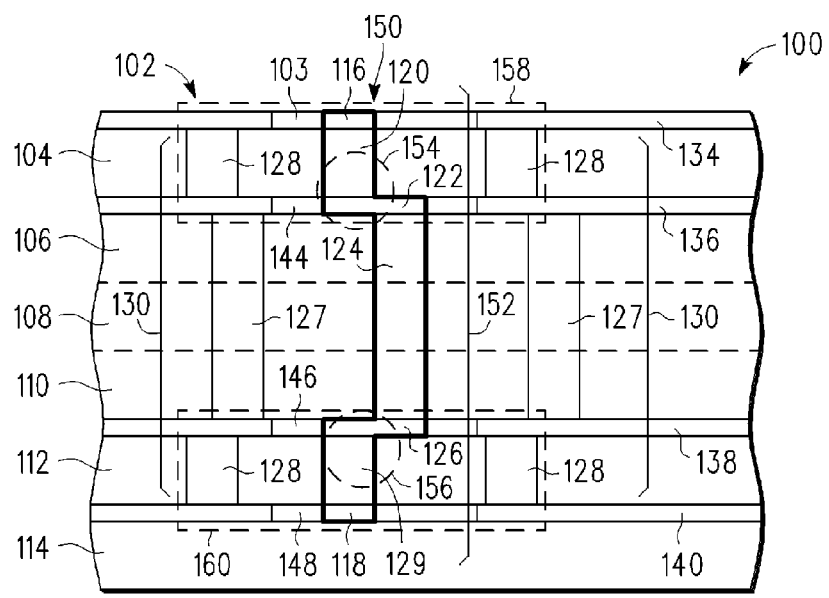
FIG. 2 is a cross-sectional view of the shielding structure of FIG. 1 along plane II-II.

FIG. 1 is a top view of an electronic device 100 that utilizes a shielding structure 102 in accordance with an exemplary embodiment of the present invention, and FIG. 2 illustrates a cross-sectional view of the electronic device 100 with the shielding structure 102 along plane II-II of FIG. 1. The electronic device 100 can be an electronic module with a plurality of layers, such as, for example, insulating layers 103, 104, 106, 108, 110, and 112, stacked sequentially on top of each other. The insulating layers 103, 104, 106, 108, 110, and 112 may comprise any dielectric material, such as for example, a ceramic, a silicon oxide, or TeOS. A layer 114 may be an additional insulating layer or may be a semiconductor substrate, such as a silicon substrate. One or more intervening insulating layers 144, 146, and 148 may also be provided adjacent and/or between the various layers 103, 104, 106, 108, 110, 112, and 114. As an example, an intervening insulating layer 144 is provided between the insulating layer 104 and the insulating layer 106. An intervening insulating layer 146 is provided between the insulating layer 110 and the insulating layer 112. An intervening insulating layer 148 is provided between the insulating layer 112 and the layer 114. As used herein, the term "intervening insulating layer" can be any layer that insulates a signal from a laterally adjacent portion of an electronic device. In one embodiment, the "intervening insulating layer" can refer to a void in an otherwise conductive layer. For example, in the illustrated embodiment, the intervening insulating layer 144 insulates a signal path 150 from an area metallization 136, which is discussed in further detail below.

One or more area metallizations 134, 136, 138, and 140 can also be provided within the device 100. For example, an area metallization 134 is provided within the insulating layer 103. An area metallization 136 is also provided within the intervening insulating layer 144. An area metallization 138 is provided within the intervening insulating layer 146. An area metallization 140 is provided within the intervening insulating layer 148. The area metallizations 134, 136, 138, and 140 can be solid, planar layers, perforated layers of conductive material, or any type of connection such as a connection trace line. In a first embodiment, the area metallizations 134, 136, 138, and 140 are formed by depositing suitable conductive material in trenches formed in the respective layer 103, 144, 146, and 148. Alternately, the area metallizations are deposited and then etched for subsequently depositing the respective intervening insulating layers 103, 144, 146, and 148.

FIG. 2 illustrates five insulating layers 104, 106, 108, 110, and 112 between the layers 103 and 114; however, in an alternate embodiment, the layers 103 and 114 are adjacent to one another. Similarly, the electronic device 100 can include a greater number or fewer number of area metallizations 134, 136, 138, and 140 and intervening insulating layers 144, 146, and 148. Additionally, other types of layers can be provided. In an alternate embodiment, the electronic device 100 includes a plurality of interconnected modules.

The electronic device 100 includes the signal path 150 that transitions from a terminal 116 to a terminal 118 in a transition region 152. For clarity, the signal path 150 has been outlined in bold in FIGS. 1 and 2. Particularly, the signal path 150 extends from the terminal 116 in the insulating layer 103, through an interconnect via 120 extending through the insulating layer 104, and to a signal trace line 122 in the intervening insulating layer 144. The signal path 150 continues through an interconnect via 124 that extends through the insulating layer 106, the insulating layer 108, and the insulating layer 110 to a signal trace line 126 in the intervening insulating layer 146. An interconnect via 129 extends from the signal trace line 126, through the insulating layer 112, to the terminal 118 in the intervening insulating layer 148. The signal trace lines 122 and 126 can be, for example, microstrip lines or coplanar waveguides. Although the signal path 150 in the illustrated embodiment of FIGS. 1 and 2 is shown extending between the terminals 116 and 118, it will be appreciated that the signal path 150 can transition between additional external terminals and internal pads. The term "signal path" can refer to a path between two terminals, i.e., the beginning and/or end of a signal path, between two signal trace lines, or any portion of a larger signal path. The term "transition region" can refer to any portion of the signal path with at least one transition. The term "transition" can refer to any portion of a signal path that extends between at least two layers and wherein the signal travels in at least two directions, generally orthogonal to one another. As examples, a transition 154 and a transition 156 are emphasized in FIG. 2 to better explain the one or more transitions that make up the transition region 152. The transition 154 includes at least a portion of the interconnect via 120 in the insulating layer 104 and at least a portion of the signal trace line 122 in the intervening insulating layer 144. The transition 156 includes at least a portion of the signal trace 126 and at least a portion of the interconnect via 129 in the insulating layer 112. It will be appreciated that other transitions are also within the illustrated transition region 152.

The shielding structure 102 is in proximity to the signal path 150 at the transition region 152 and includes a plurality of shielding vias 130 proximate to at least two areas, such as sides, corners, surfaces, regions, or the like of the signal path 150. The shielding vias 130 can be on any side of the signal path 150, including opposing sides of the signal path 150 as shown in FIG. 2. The shielding vias 130 include one or more through vias 127 and/or one or more micro vias 128. The through vias 127 are vias that extend through at least two layers, such as through the insulating layer 106, the insulating layer 108, and the insulating layer 110, and the micro vias 128 are vias that extend through one layer, such as through the insulating layer 104 or through the insulating layer 112. Each of the through vias 127 and micro vias 128 can be a laser drilled or chemically etched hole, which is then filled with conductive materials to provide vertical connection between the respective layers. Each of the through vias 127 and micro vias 128 can have any suitable cross-sectional shape, such as for example, circular, square, or rectangular. The conductive materials can be, for example, tungsten, copper, gold, or electrically conductive polymers.

The area metallizations 134, 136, 138, and 140 can form part of the shielding structure 102, and are coupled to the shielding vias 130. The area metallizations 134, 136, 138, and 140 can provide a connection for the shielding vias 130 to effectively shield all or part the signal path 150, including the transition region 152. The area metallizations 134, 136, 138, and 140 can extend between the shielding vias 130, i.e., the footprint of the shielding vias 130, or the area metallizations 134, 136, 138, and 140 can extend beyond one or more of the shielding vias 130. The conductive metal suitable for the area metallizations 134, 136, 138, and 140 can include copper, aluminum, gold or the combination of other type of shielding materials. In an exemplary embodiment, the area metallizations can have a thickness of, for example, 5 µm to 25 µm.

The area metallizations 134, 136, 138, and 140 and shielding vias 130 of the shielding structure 102 can provide a shield for EMI on all sides of the transition region 152 of the signal path 150, e.g., the area metallizations 134, 136, 138, and 140 can be above and below the signal path 150 and the shielding vias 130 can be on opposing sides of the transition region 152 of the signal path 150 as shown in FIG. 2. As noted above, current flowing in other signal paths and other sources can induce EMI that would otherwise interfere with the signal path 150, particularly at the transition region 152. The shielding structure 102 prevents the EMI from interfering with the signal path 150 by confining or reflecting the EMI. In other words, the shielding structure 102 provides protection for the signal path 150 from external EMI and minimizes the emission from signal path 150 itself. In some instances, the EMI may induce a current in the shielding structure 102 instead of producing an unwanted current in the signal path 150. In an exemplary embodiment, the shielding structure 102 is grounded.

The shielding structure 102 can include shielding structure portions (e.g., 158 and 160 in FIG. 2) to shield individual transitions (e.g., 154 and 156). By way of example, shielding structures portions 158 and 160 are emphasized in FIG. 2 for clarity. The shielding structure portion 158 shields the transition 154 and includes the micro vias 128 in the insulating layer 104 on either side of the transition 154 and the area metallizations 134 and 136. The shielding structure portion 160 shields the transition 156 and includes the micro vias 128 in the insulating layer 112 on either side of the transition 156 and the area metallizations 138 and 140. The shielding structure portions 158 and 160 can be electrically connected with the through vias 127, for example, to shield the transition from the signal trace line 122 to the interconnect via 124 proximate to the transition 154 and the transition from the interconnect via 124 to the signal trace line 126 proximate to transition 156. In an alternate embodiment, the shielding structure portions 158 and 160 can be considered two separate shielding structures. Other combinations of the shielding vias 130 and area metallizations 134, 136, 138, and 140 can be considered part of the shielding structure portions for the transitions 154 and 156, as well as part of other shielding structure portions for other transitions. Generally, the more shielding vias 130 and area metallizations 134, 136, 138, and 140 associated with each transition, the better the shielding.

Figure 3:
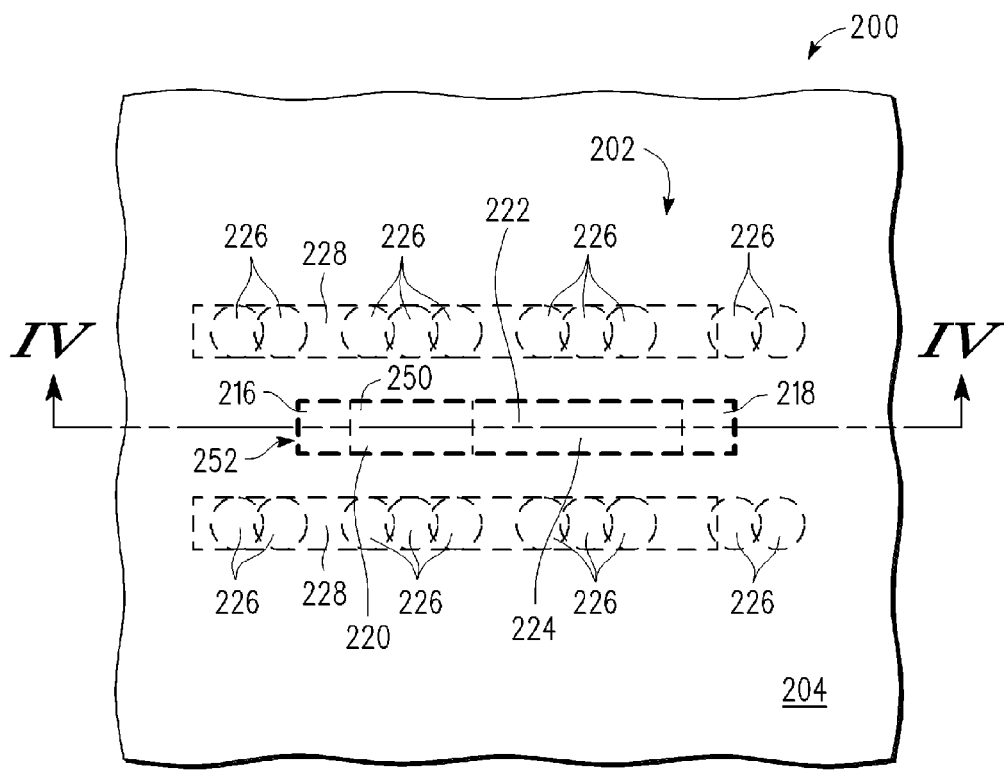
FIG. 3 is a top view of an electronic device with a shielding structure in accordance with another exemplary embodiment of the present invention.
Figure 4:
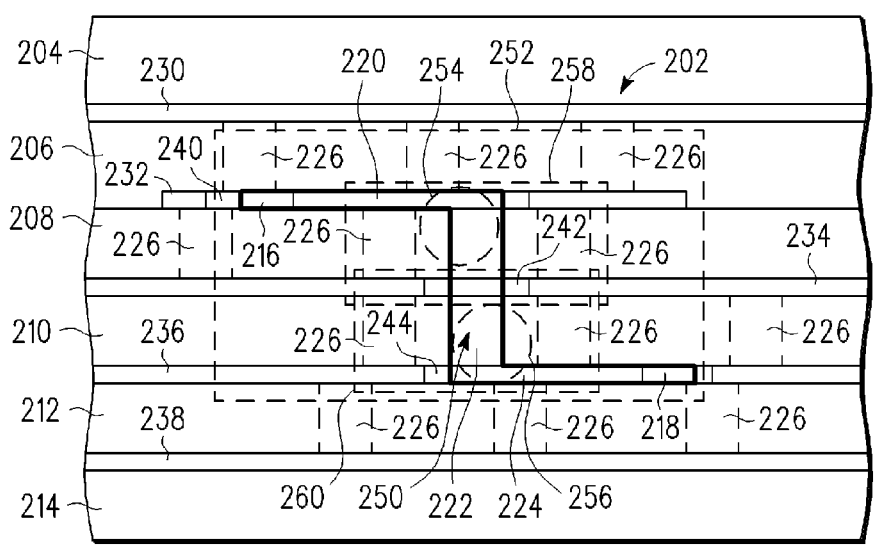
FIG. 4 is a cross-sectional view of the shielding structure of FIG. 3 along plane IV-IV.

FIG. 3 is a top view of an electronic device 200 that utilizes a shielding structure 202 in accordance with another exemplary embodiment of the present invention, and FIG. 4 illustrates a cross-sectional view of the electronic device 200 with the shielding structure 202 along plane IV-IV of FIG. 3. The electronic device 200 can be an electronic module with a plurality of layers, such as, for example, an insulating layer 204, an insulating layer 206, an insulating layer 208, an insulating layer 210, an insulating layer 212, and a layer 214 stacked sequentially on top of each other. The layer 214 may be an additional insulating layer or may be a semiconductor substrate, such as a silicon substrate. The insulating layers 204, 206, 208, 210, and 212 may comprise any dielectric material, for example, ceramic, flame resistant 4 (FR-4), silicon oxides, and similar materials.

One or more intervening insulating layers 240, 242, and 244 may also be provided adjacent and/or between the various insulating layers 204, 206, 208, 210, 212, and 214. For example, an intervening insulating layer 240 is provided between the insulating layer 206 and the insulating layer 208. An intervening insulating layer 242 is provided between the insulating layer 208 and the insulating layer 210. An intervening insulating layer 244 is provided between the insulating layer 210 and the insulating layer 212.

One or more area metallizations 230, 232, 234, 236, and 238 can also be provided. For example, an area metallization 230 is provided between the insulating layer 204 and the insulating layer 206. An area metallization 232 is provided within the intervening insulating layer 240. An area metallization 234 is provided within the intervening insulating layer 242. An area metallization 236 is provided within the intervening insulating layer 244. An area metallization 238 is provided between the insulating layer 212 and the insulating layer 214. The area metallizations 230, 232, 234, and 238 can be solid, planar layers, perforated layers of conductive material, or any type of connection such as a connection trace line. In a first embodiment, the area metallizations 232, 234, and 236 are formed by depositing suitable conductive material in trenches formed in the respective intervening layer 240, 242, and 244. Alternately, the area metallizations 232, 234, and 236 are deposited and then etched for subsequently depositing the respective intervening insulating layers 240, 242, and 244.

The electronic device 200 can include a signal path 250 that transitions from a terminal 216 to a terminal 218 in a transition region 252. For clarity, the signal path 250 has been outlined in bold in FIGS. 3 and 4. Particularly, the signal path 250 extends from the terminal 216 in the intervening insulating layer 240, and through a signal trace line 220 to an interconnect via 222. The interconnect via 222 extends through the insulating layer 208, through the intervening insulating layer 242, and through the insulating layer 210 to a signal trace line 224 in the intervening insulating layer 244. The signal trace line 224 extends to the terminal 218, also in the intervening insulating layer 244, to complete the signal path 250 from the terminal 216 to the terminal 218. As noted above, the signal path 250 includes one or more transitions (e.g., 254 and 256). By way of example, the transition 254 includes at least a portion of the signal trace line 220 and at least a portion of the interconnect via 222, and the transition 256 includes at least a portion of the interconnect via 222 and at least a portion of the signal trace line 224. It will be appreciated that other transitions are also within the transition region 254 depicted within FIG. 4.

The shielding structure 202 protects the signal path 250 from interference, particularly in the transition region 252. The shielding structure 202 includes one or more shielding vias 226 on at least two sides of the signal path 250. FIGS. 3 and 4 illustrate one embodiment that includes twenty-four shielding vias 226, twelve of which are shown in FIG. 4 in the insulating layer 206, the insulating layer 208, the insulating layer 210, and the insulating layer 212. As in the embodiment illustrated in FIGS. 1 and 2, each of the shielding vias 226 can be a laser drilled or chemically etched hole, which is then filled with conductive materials to provide vertical connection between the respective layers. The conductive materials can be, for example, tungsten, copper, gold, or other electrically conductive polymers. Each of the shielding vias 226 can have any suitable cross-sectional shape, such as for example, circular, square, or rectangular.

The area metallizations 230, 232, 234, 236, and 238 can form part of the shielding structure 202, and are coupled to the shielding vias 226. The area metallizations 230, 232, 234, 236, and 238 can provide a ground for the shielding vias 226 to effectively shield the signal path 250, including the transition region 252. The area metallizations 230, 232, 234, 236, and 238 can extend between the shielding vias 226, i.e., the footprint of the shielding vias 226, or the area metallizations 230, 232, 234, 236, and 238 can extend beyond the shielding vias 226. As in the embodiments above, the area metallizations 230, 234, 236, and 238 and the shielding vias 226 can provide EMI shielding in at least two areas, preferably four areas, of the transition region 252 of the signal path 250. In an exemplary embodiment, the at least two areas are on opposing sides.

The shielding structure 202 can include shielding structure portions (e.g., 258 and 260 in FIG. 4) to shield individual transitions (e.g., 254 and 256). By way of example, shielding structures portions 258 and 260 are described in detail for clarity. The shielding structure portion 258 shields the transition 254 and includes two of the micro vias 226 in the insulating layer 208 on either side of the transition 254 and the area metallizations 230, 232 and 234. It will be appreciated that other shielding vias and area metallizations can contribute to the shielding of the transition 254, such as for example, the micro vias 226 in the insulating layer 206. The shielding structure portion 260 shields the transition 256 and includes the micro vias 226 in the insulating layer 212 on either side of the transition 256 and the area metallizations 236 and 234. It will be appreciated that other shielding vias and area metallizations can contribute to the shielding of the transition 256, such as for example, the micro vias 226 in the insulating layer 210 and the area metallization 238. Other combinations of the shielding vias 226 and area metallizations 230, 232, 234, 236, and 238 can be considered part of the shielding structure portions for the transitions 254 and 256, as well as part of other shielding structure portions for other transitions. Generally, the more shielding vias 226 and area metallizations 230, 232, 234, 236, and 238 associated with each transition, the better the shielding.

Figures 5, 6:
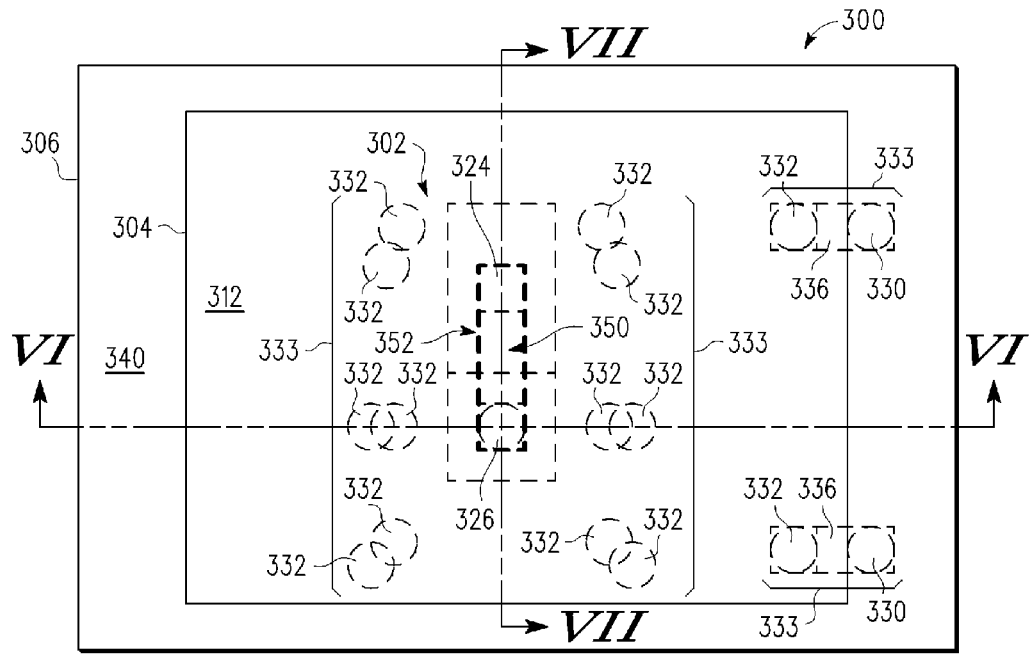
FIG. 5 is a top view of an electronic device with a shielding structure in accordance with another exemplary embodiment of the present invention.
FIG. 6 is a cross-sectional view of the shielding structure of FIG. 5 along plane VI-VI.
Figure 7:
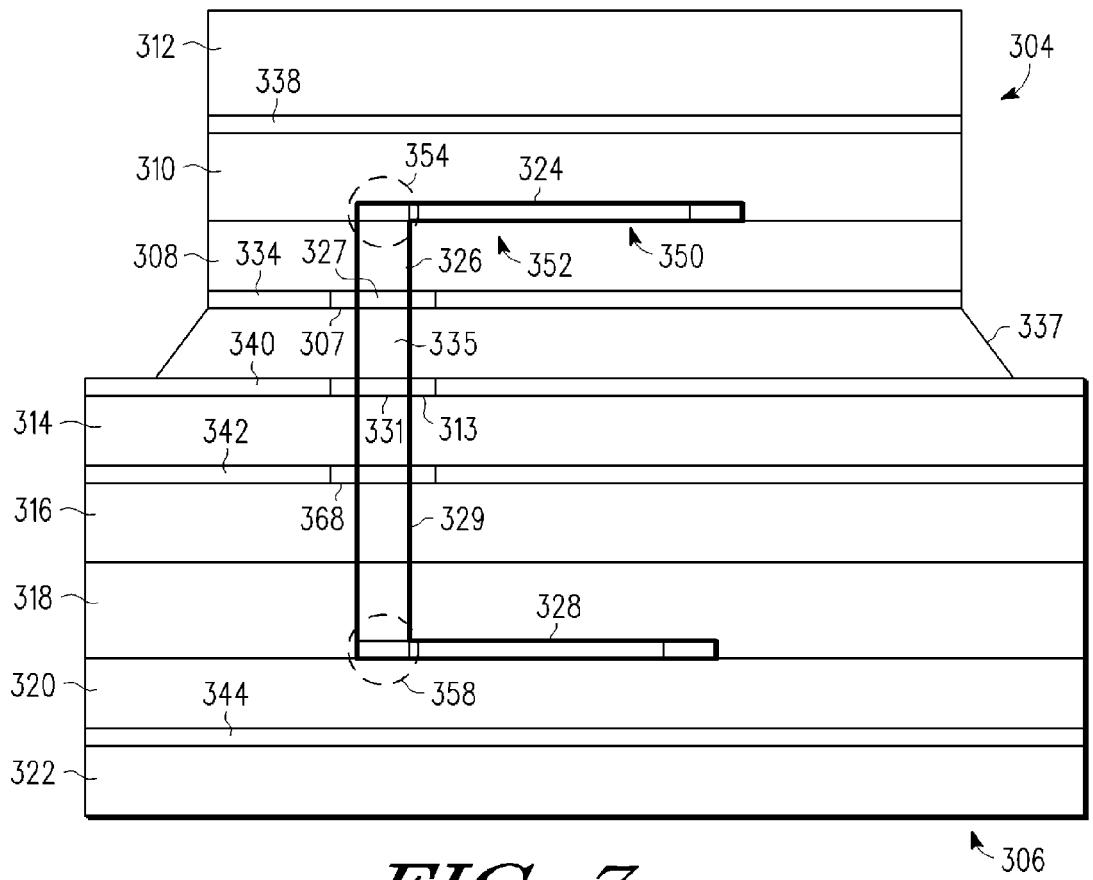
FIG. 7 is a cross-sectional view of the shielding structure of FIG. 5 along plane VII-VII.

As illustrated in FIGS. 5-7, another exemplary embodiment of the present invention includes an electronic device 300 formed by two electronic modules 304 and 306 and utilizes a shielding structure 302. The shielding structure 302 in the electronic device 300 shields a signal path 350 transitioning between the electronic module 304 and the electronic module 306 at a transition region 352. For clarity, the signal path 350 has been outlined in bold in FIGS. 5-7. As an example, the electronic device 300 can be a flip chip module, which includes the electronic module 304 as a die and the electronic module 306 as a package substrate. Each of the electronic modules 304 and 306 can have one or more functional components. For example, the electronic module 304 includes at least one layer, such as for example, four layers 307, 308, 310, and 312. The four layers of the electronic module 304 can include an insulating layer 307, an insulating layer 308, an insulating layer 310, and a layer 312. The layer 312 may be an insulating layer or may be a semiconductor substrate, such as a silicon-containing substrate. The electronic module 304 can further include one or more area metallizations 334 and 338. For example, an area metallization 334 can be provided within the insulating layer 307, and an area metallization 338 can be provided between the insulating layer 310 and the insulating layer 312.

The electronic module 306 includes at least one layer, such as for example, five insulating layers 313, 314, 316, 318, and 320. A layer 322 may be an insulating layer or may be a semiconductor substrate, such as a silicon-containing substrate. The electronic module 306 can further include one or more intervening insulating layers, such as an intervening insulating layer 368 between the insulating layer 314 and the insulating layer 316. One or more area metallizations 340, 342, and 344 can also be provided. For example, an area metallization 340 is provided within the insulating layer 313. An area metallization 342 is provided within the intervening insulating layer 368, and an area metallization 344 is provided between the insulating layer 320 and the insulating layer 322.

The signal path 350 can extend from a signal trace line 324 between the insulating layer 308 and the insulating layer 310 of the electronic module 304 to an interconnect via 326. In an alternate exemplary embodiment, the signal path 350 can extend to other layers, such as the layer 312 and/or the layer 322. The interconnect via 326 can be a micro via that extends from the signal trace line 324, and through the insulating layer 308 to a pad 327 formed within the insulating layer 307. In the electronic module 306, an interconnect via 329 extends from a signal trace line 328 between the insulating layers 318 and 320 and through the insulating layer 318, the insulating layer 316, the intervening insulating layer 368, the insulating layer 314, and to a pad 331 formed within the intervening insulating layer 313. The pad 331 of the module 306 and the pad 327 of the module 304 can be coupled by an interconnect bump 335 to thus couple the modules 304 and 306 together and complete the signal path 350. The interconnect bump 335 can be a Land Grid Array (LGA), flip-chip bump, copper-pillar bump, or similar connection mechanism. The signal trace lines 324 and 328 can be, for example, microstrip lines or coplanar waveguides. Underfill 337 can also be provided to secure the modules 304 and 306 together.

As one example, a transition 354 is emphasized in FIGS. 6 and 7 to better explain the one or more transitions that make up a transition region 352 for the signal path 350. The transition 354 includes at least a portion of the signal trace line 324 and at least a portion of the interconnect via 326. As another example, a transition 358 includes at least a portion of the signal trace 328 and at least a portion of the interconnect via 329.

The shielding structure 302 is in proximity to the signal path 350 at the transition region 352 and includes one or more shielding vias 333 on at least two sides of the signal path 350. The shielding vias 333 can include one or more micro vias 330 and/or one or more through vias 332. The shielding structure can also include one or more bumps 370 that extended between the modules 304 and 306. The through vias 332 extend through more than one layer, and the micro vias 330 extend through one layer.

The area metallizations 334, 336, 338, 340, 342, and 344 can form part of the shielding structure 302, and are coupled to the shielding vias 333 and the bumps 370. The area metallizations 334, 336, 338, 340, 342, and 344, together with shielding vias 333 and bumps 370, can effectively shield the signal path 350. The area metallizations 334, 336, 338, 340, 342, and 344 can extend between the shielding vias 333, i.e., the footprint of the shielding vias 333, or the area metallizations 334, 336, 338, 340, 342, and 344 can extend beyond the shielding vias 333.

The shielding structure 302 can include shielding structure portions (e.g., 356 and 360 in FIG. 6) to shield individual transitions (e.g., 354 and 358). By way of example, shielding structures portions 356 and 360 are emphasized in FIG. 6 for clarity. The shielding structure portion 356 shields the transition 354 and includes two of the through vias 332 in the insulating layer 308 and the insulating layer 310 on either side of the transition 354 and the area metallizations 334 and 338. The shielding structure portion 360 shields the transition 358 and includes the through vias 332 in the insulating layer 316, the insulating layer 318, and the insulating layer 320 on either side of the transition 358 and the area metallizations 342 and 344. The shielding structure portions 356 and 360 can be electrically connected and/or grounded to provide a complete shielding system, although it can be appreciated that the shielding structure portions 356 and 360 can be considered separate shielding structures. Other combinations of the shielding vias 333 and area metallizations 334, 336, 338, 340, 342, and 344 can be considered part of the shielding structure portions for the transitions 354 and 358, as well as part of other shielding structure portions for other transitions. For example, area metallization 336 can be considered part of the shielding structure portion 360, or for example, the through vias 332 that extend through the insulating layer 316, the insulating layer 318, and the insulating layer 320 can be replaced with one or more micro vias and/or one or more additional area metallizations. Generally, the more shielding vias 333 and area metallizations 334, 336, 338, 340, 342, and 344 associated with each transition, the better the shielding.

Embodiments of the shielding structures 102, 202, and 302 provide continuous shielding for the signal path 150, 250, and 350 between two terminals, such as the terminals 116 and 118, terminals 216 and 218 and/or the signal trace lines 324 and 328, and particularly in transition regions 152, 252, and 352, respectively. The shielding structures 102, 202, and 302 can further provide an integrated and continuous grounding and a complete system level shielding, for example, for single line signal paths and differential signal paths. Furthermore, although the electronic devices 100, 200, and 300 may contain circuitry sensitive to EMI, the shielding structures 102, 202, and 302 substantially encapsulate and provide an electrically isolated environment for the signal path 150, 250, and 350 that shield the signal path from EMI.

The number, placement, and type of shielding vias 130, 226, and 333 and/or bumps 370 can be varied to optimize performance. In one exemplary embodiment, the shielding vias 130, 226, and 333 and/or bumps 370 are positioned, for example within 20, 40, 100, 300 microns, or greater from the signal path 150, 250, and 350. The shielding vias 130, 226, and 333 and/or bumps 370 can be placed on additional sides of the signal path 150, 250, and 350, for example, on third and fourth sides of the signal path 150, 250, and 350. The density of the shielding vias 130, 226, and 333 and/or bumps 370 can also be increased or decreased depending on the desired shielding characteristics. The size, shape, and position of the area metallizations 134, 136, 138, and 140, the area metallizations 230, 232, 234, 236, and 238, and the area metallizations 334, 336, 338, 340, 342, and 344 can be varied to optimize performance. In one embodiment, the frequency range and the desired signal integrity of the particular application at least partially dictate the design of the shielding structure 102, 202, 302. Design tools for signal integrity and three-dimensional electromagnetic (EM) analysis can be utilized to optimize the placement and arrangement of the shielding structures 102, 202, 302, for example, in ultra-wide band applications.

Figure 8:
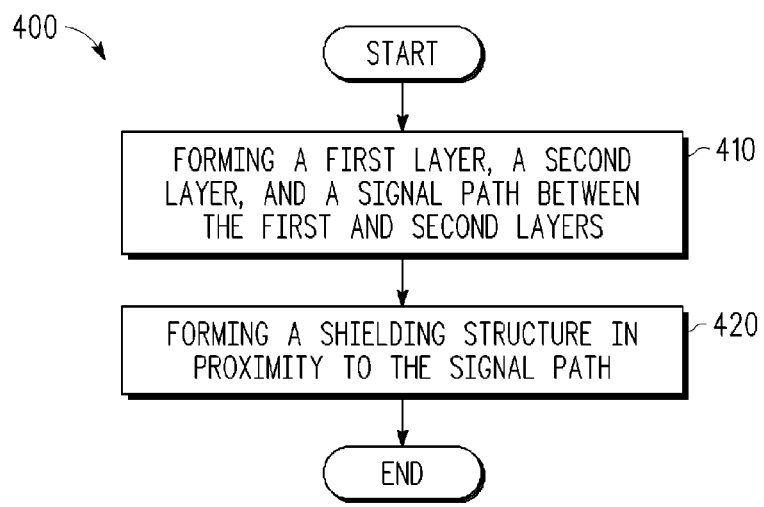
FIG. 8 is a flow chart illustrating a method for manufacturing an electronic device with a shielding structure in accordance with an exemplary embodiment of the present invention.

Referring to FIG. 8, a method 400 for manufacturing an electronic device having a shielding structure, such as the shielding structure 102, 202, and 302 described above, in accordance with another exemplary embodiment of the present invention comprises forming two layers in a semiconductor device and a signal path between the layers (step 410). The signal path can include a transition region with at least one transition of the signal path that extends in a first direction and a second direction orthogonal to the first direction. The method further comprises forming a shielding structure in proximity to the signal path (step 420). The shielding structure can include a plurality of shielding vias on either side of the signal path, particularly, for example, at the at least one transition, and one or more area metallizations coupled to the plurality of shielding vias. The first and second layers can be in a single semiconductor module or a multiple semiconductor modules. In one example, the first layer is a die layer, and the second layer is a package substrate layer. In an exemplary embodiment, portions of the shielding structures can be formed simultaneously with the formation of portions of the signal path.

Various embodiments of the present invention can provide a system level signal integrity for all critical signal paths in a multi-layer module and between modules in multi-module electronic devices. Embodiments of the shielding structures can be provided for single signals, differential signals, and multiple non-harmonious signals. Moreover, by providing a shielding structure within an electronic device, external shielding does not have to be added by the manufacturer or the customer. Embodiments of the present invention can be used in high performance applications, ultra wide band applications, millimeter wave RF applications, and/or high speed digital applications.

In accordance with an exemplary embodiment, a shielding structure is provided for shielding a signal path extending between a first layer and a second layer in an electronic device at a transition region with a transition that extends in a first direction and a second direction orthogonal to the first direction. The shielding structure includes a shielding structure portion, which includes a first shielding via in proximity to a first area of the signal path at the transition; a second shielding via in proximity to a second area of the signal path at the transition; and an area metallization electrically coupled to the first shielding via. The area metallization can additionally be electrically coupled to the second shielding via. The first layer can be a layer in a first module and the second layer is in a second module. The signal path can include an interconnect bump extending from the first module to the second module, and the shielding structure portion can include a shielding bump in proximity to the interconnect bump. The area metallization can be a first area metallization of the first module, and the shielding structure portion can further include a second area metallization of the second module with the shielding bump extending from the first area metallization to the second area metallization. The shielding structure portion can further include a third shielding via in proximity to a third area of the signal path at the transition and a fourth shielding via in proximity to a fourth area of the signal path at the transition. The area metallization can be a first area metallization above the transition and the shielding structure can further include a second area metallization below the transition. The area metallization can ground the first shielding via. A first plurality of shielding vias and a second plurality of shielding vias can extend in proximity to the signal path from a signal start point to a signal end point.

In accordance with another exemplary embodiment, an electronic device is provided, and includes a first layer; a second layer overlying the first layer; a signal line extending between the first and second layers and having a transition region with at least one transition extending in first and second directions, orthogonal to one another; and a shielding structure for shielding the signal line proximate to the transition region. The shielding structure includes a shielding structure portion having a first shielding via in proximity to a first area of the signal path at the transition, a second shielding via in proximity to a second area of the signal path at the transition on an opposing side of the first area, and an area metallization electrically coupled to the first shielding via.

The shielding structure portion of the shielding structure can further include a third shielding via in proximity to a third area of the signal path at the transition and a fourth shielding via in proximity to a fourth area of the signal path at the transition. The area metallization can be additionally electrically coupled to the second shielding via. The area metallization can ground the first shielding via and the second shielding via. The signal path can include a start point at the first layer and an end point at the second layer, and a first plurality of shielding vias and a second plurality of shielding vias can extend in proximity to substantially all of the signal path from the start point to the end point. The first shielding via and the second shielding via can each include a through via or a micro via. The signal line can be a single signal line or a differential signal line. The first shielding via and the second shielding via can be within 100 microns of the signal line. The electronic device can include a first module and a second module coupled to the first module, and the signal path can include an interconnect bump extending between the first and second module. The area metallization can be a first area metallization of the first module and the shielding structure can further include a second area metallization of the second module and a shielding bump extending between the first and second area metallizations. The first module can be a flip-chip.

In accordance with another exemplary embodiment, a method of manufacturing an electronic device is provided. The method comprises the steps of: forming a first layer and a second layer with a signal path transitioning from the first layer to the second layer and having a transition region with a transition extending in a first direction and a second direction orthogonal to the first direction; and forming a shielding structure in proximity to two areas of the signal path at the transition. The shielding structure includes a first shielding via proximate to a first area of the signal path at the transition, a second shielding via proximate to a second side of the signal path at the transition, and an area metallization coupled to the first shielding via and the second shielding via. The step of forming the first layer and the second layer and the step of forming the shielding structure can be performed simultaneously While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A shielding structure for shielding a signal path extending between a first layer and a second layer in an electronic device at a transition region with a transition, wherein the transition extends in a first direction and a second direction orthogonal to the first direction, the shielding structure including a shielding structure portion, comprising:
a first shielding via in proximity to a first area of the signal path at the transition;
a second shielding via in proximity to a second area of the signal path at the transition; and
an area metallization electrically coupled to the first shielding via;
wherein the first layer is in a first module and the second layer is in a second module, wherein the signal path comprises an interconnect bump extending from the first module to the second module, and wherein the shielding structure portion further comprises a shielding bump in proximity to the interconnect bump.

2. The shielding structure of claim 1, wherein the area metallization is additionally electrically coupled to the second shielding via.

3. The shielding structure of claim 1, wherein the area metallization is a first area metallization of the first module, and wherein the shielding structure portion further comprises a second area metallization of the second module, the shielding bump extending from the first area metallization to the second area metallization.

4. The shielding structure of claim 1, wherein the shielding structure portion further comprises a third shielding via in proximity to a third area of the signal path at the transition and a fourth shielding via in proximity to a fourth area of the signal path at the transition.

5. The shielding structure of claim 1, wherein the area metallization is a first area metallization above the transition and the shielding structure further comprises a second area metallization below the transition.

6. The shielding structure of claim 1, wherein the area metallization grounds the first shielding via.

7. The shielding structure of claim 1, wherein the first shielding via is one of a first plurality of shielding vias and the second shielding via is one of a second plurality of shielding vias, and wherein the first and second pluralities of shielding vias extend in proximity to the signal path from a signal start point to a signal end point.

8. A shielding structure for shielding a signal path, the shielding structure comprising:
a first shielding via in proximity to a first area of the signal path at a transition, wherein the signal path extends between a first layer of a first module and a second layer of a second module, the signal path comprises an interconnect bump extending between the first and second modules, and the signal path further includes a transition region with at least one transition extending in a first direction and a second direction that is orthogonal to the second direction, the first module comprising a flip-chip;
a second shielding via in proximity to a second area of the signal path at the transition, wherein the first and second areas are on opposing sides of the signal path;
a first area metallization electrically coupled to the first shielding via;
a second area metallization electrically coupled to the second shielding via; and
a shielding bump extending between the first and second area metallizations.

9. The shielding structure of claim 8, further comprising:
a third shielding via in proximity to a third area of the signal path at the transition; and
a fourth shielding via in proximity to a fourth area of the signal path at the transition.

10. The shielding structure of claim 8, wherein the first area metallization is additionally electrically coupled to the second shielding via.

11. The shielding structure of claim 10, wherein the first and second area metallizations collectively ground the first shielding via and the second shielding via.

12. The shielding structure of claim 11, wherein the signal path includes a start point at the first layer and an end point at the second layer, and wherein the first shielding via is one of a first plurality of shielding vias and the second shielding via is one of a second plurality of shielding vias, wherein the first and second pluralities of shielding vias extend in proximity to substantially all of the signal path from the start point to the end point.

13. The shielding structure of claim 8, wherein the first shielding via and the second shielding via each comprise a through via or a micro via.

14. The shielding structure of claim 8, wherein the signal path is a single signal path or a differential signal path.

15. The shielding structure of claim 8, wherein the first shielding via and the second shielding via are within 100 microns of the signal path.

* * * * *